(12) United States Patent
Kobayashi

(10) Patent No.: US 7,802,516 B2
(45) Date of Patent: Sep. 28, 2010

(54) SCREEN PRINTING METHOD AND APPARATUS INCLUDING TWO SQUEEGEES WITH DIFFERENT LENGTHS AND PRESSURES

(75) Inventor: Masakazu Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 10 days.

(21) Appl. No.: 12/222,797

(22) Filed: Aug. 15, 2008

(65) Prior Publication Data

US 2009/0158943 A1 Jun. 25, 2009

(30) Foreign Application Priority Data

Dec. 25, 2007 (JP) ............... 2007-331649

(51) Int. Cl.
*B41F 15/44* (2006.01)
*B41F 15/42* (2006.01)

(52) U.S. Cl. .................. 101/129; 101/123; 101/114

(58) Field of Classification Search ........... 101/123, 101/124, 114, 129; *B41F 15/44, 15/42, 15/46*
See application file for complete search history.

(56) References Cited

U.S. PATENT DOCUMENTS

2002/0108513 A1* 8/2002 Onishi et al. ............... 101/129

FOREIGN PATENT DOCUMENTS

| JP | 58090981 A | * | 5/1983 |
| JP | 62146627 A | * | 6/1987 |
| JP | 8-39766 | | 2/1996 |
| JP | 08197712 A | * | 8/1996 |
| JP | 2001-14943 | | 1/2001 |
| JP | 2003048303 A | * | 2/2003 |
| JP | 2005343116 A | * | 12/2005 |
| JP | 2006-167992 | | 6/2006 |
| JP | 2007144914 A | * | 6/2007 |

* cited by examiner

*Primary Examiner*—Leslie J Evanisko
(74) *Attorney, Agent, or Firm*—Staas & Halsey LLP

(57) ABSTRACT

A screen printing device configured to print a printing paste on a printed board, the printing paste being applied on a screen printing plate where openings corresponding to a pattern to be printed are formed, the screen printing device includes a first squeegee advanced and pressed downward so that the printing paste is pushed on the printed board corresponding to the openings of the screen printing plate; and a second squeegee situated in the vicinity of the rear of the first squeegee, the second squeegee being configured to provide pressure forward and downward, the pressure having properties different from properties of a pressure provided by the first squeegee, wherein a printing operation by the second squeegee is performed right after a printing operation by the first squeegee.

8 Claims, 7 Drawing Sheets

SCREEN PRINTING METHOD AND APPARATUS INCLUDING TWO SQUEEGEES WITH DIFFERENT LENGTHS AND PRESSURES

BACKGROUND OF THE INVENTION

1. Field of the Invention

The present invention generally relates to screen printing devices and screen printing methods.

More specifically, the present invention relates to a screen printing device for printing paste and a squeegee screen printing method.

2. Description of the Related Art

FIG. 1 is a schematic view for explaining related art screen printing using a solder paste. FIG. 1(a) shows the screen printing in progress and FIG. 1(b) shows the completed screen printing.

A squeegee 50 is configured to move while pressing a solder paste 51 downward and pushing the solder paste 51 forward. The solder paste 51 is a printing subject made of particles of solder and particles of flux. Openings (or holes) 53 are provided at a portion of a screen printing plate (metal mask) 52 whose base is metal, which is the portion where the solder paste 51 is to be printed. Solder pastes 54 are provided in the openings 53. A printed wire 55 is provided on a surface of a printed board 56. The squeegee 50 is driven forward and backward by a driving mechanism (not shown in FIG. 1).

In the above-mentioned screen printing device using the solder paste, first, the screen printing plate (metal mask) 52 having thickness of 0.15 mm is positioned on the printed board 56 which is a printing subject. Holes are provided at parts where the paste is to be printed. A piece of the squeegee 50 is inclined at a certain angle in a moving direction. The squeegee 50 is advanced while the squeegee 50 presses the solder paste 51 in a screen printing plate 52 direction (downward). By pressing the solder paste 51 onto the printed board 56 via the openings 53 of the screen printing plate 52, the solder paste 51 is forced into the openings 53. After that, by removing the screen printing plate 52 from the printed board 56 slowly, as shown in FIG. 1(B), the solder paste 51 provided in the openings 53 remains printed on the printed board 56.

In order to exert a force for pressing the solder paste 51 downward, the squeegee 50 is normally provided so as to be inclined at approximately 20 through 45 degrees. As a result of this, an upper part of the squeegee 50 projects in the moving direction compared with a position where the squeegee 50 comes in contact with the screen printing plate 52. In addition, when the squeegee 50 is advanced, the squeegee 50 is pressed downward by an outside driving force so as to stand against a reaction force from the solder paste 51 having high viscosity and density. Since the squeegee 50 should endure against a printing pressure (a force for driving downward) when the squeegee 50 is inclined forward, a certain degree of strength is required. Since the printing pressure in the downward direction is normally applied to the printed board 56 via the screen printing plate 52, a backup block or backup pin (not shown in FIG. 1) is provided under the printed board 56 so that the printed board 56 is supported.

The printing pressure is an important control item in a solder paste screen printing device. Accordingly, in recent printing devices, even if the printed board is curved, "feedback control" is applied, where pressure is detected and the printing pressure is controlled so as to be increased or reduced based on the detected output, so that a certain printing pressure can be maintained. In order to increase the ability to adhere to the screen printing plate 52 and follow a slight curve or deformation of the printed board 56, the squeegee 50 is made of urethane rubber or a flexible metal plate having thickness of approximately 0.2 mm through approximately 0.5 mm (normally stainless).

In the example shown in FIG. 1, printing of the solder paste 51 is performed in a single direction (for example, from right to left). As a technique which is an improvement of the example shown in FIG. 1, an example shown in FIG. 2 is suggested. The example shown in FIG. 2 is discussed in Japanese Laid-Open Patent Application Publication No. 2006-167992. In this example, two squeegees 50 are provided in a right and left symmetric manner to print in opposite directions. Bi-directional printing can be done such as from right to left or from left to right.

FIG. 2 is a view for explaining a case where two squeegees 50a and sob are used. A numerical reference 35 indicates a mask frame. As shown in FIG. 2(a), the second squeegee Sob moves from a home position downward in a vertical direction so as to come in contact with a screen printing plate 52. Then, as shown in FIG. 2(b), each of the squeegees 50a and 50b starts moving to a left side in a horizontal direction. By this movement, a solder paste on the screen printing plate 52 fills piercing openings (not shown in FIG. 2) formed in the screen printing plate 52. When the squeegees 50a and 50b arrive in the vicinity of an opposite end part of the screen printing plate 52, namely a position shown in FIG. 2(c), the squeegee 50a moves downward in the vertical direction and the squeegee 50b moves upward in the vertical direction so that the disposition shown in FIG. 2(d) is formed. The squeegee 50b moves to the height of the home position so that the squeegee 50a comes in contact with the screen printing plate 52. An electronic circuit board is adhered on a lower surface of the screen printing plate 52. After one pass of the squeegees 50a and 50b is completed, the electronic circuit board is removed from the screen printing plate 52. By this removal, the solder paste is transferred onto the electronic circuit board. After this, a new electronic circuit board is attached and the squeegees 50a and sob are moved to a right side in the horizontal direction as shown in FIG. 2(d). When the squeegees 50a and sob arrive in the vicinity of the opposite side end part of the screen printing plate 52 as shown in FIG. 2(e), the solder paste provided on the screen printing plate 52 is squeezed by the movement of the squeegee 50a again so that a pattern of the solder paste is printed on a new electronic circuit board.

In the related art cases, since the printing pressure of the squeegee is finally applied to the printed board, it is necessary to support the board from the lower surface of the board. On the other hand, in recent years, two-surface mounting boards where components are mounted on both upper and lower surfaces of the board have been mainly used. When a second component is mounted on one surface of the board after a first component is mounted on the other surface of the board, the first component is provided on the lower surface of the board and therefore the lower surface other than an area where the first component is provided need to be supported by a backup pin or the like.

FIG. 3 is a view for explaining screen printing applied to a surface of a board having a rear surface where components are mounted. In FIG. 3, parts that are given the numerical references 50 through 52 and 56 correspond to the parts having the same numerical references of FIG. 1. In other words, the numerical reference 50 represents the squeegee 50, the numerical reference 51 represents the solder paste, the numerical reference 52 represents the screen printing plate (metal mask), and the numerical reference 56 represents the printed wiring board. A base 57 is configured to support the printed board 56. Backup pins 58a through 58g are provided on the base 57. Components 59, such as an integrated circuit or resister, are provided on a rear surface of the printed board 56. As shown in FIG. 3(a), one end of each of the backup pins 58 is situated in a part of the rear surface of the printed board 56 where the components 59 are not mounted. Other ends of the backup pins 58 are fixed on the base 57. Accordingly, it is possible to prevent the printed board 56 from being bent downward when a printing pressure is applied in a lower direction for printing the solder paste by the squeegee 50.

However, in a part where the components are provided in a line, namely a section between the backup pins 58e and 58f shown in FIG. 3(a), the printed board 56 is curved downward due to the downward printing pressure of the squeegee 50. In this case, as shown in FIG. 3(b), the squeegee 50 cannot follow the bending and therefore the printed board 56 may be damaged if pressure is applied to the squeegee 50 in a depresses position, and thereby thin solder paste 51 remains on the screen printing plate 52.

It is normal practice that the solder paste 51 may not remain on the screen printing plate 52 other than inside of the openings after the squeegee 50 passes. However, if the solder paste 51 remains, the solder paste 51 may cover the openings of the screen printing plate 52 and therefore the solder paste inside the openings may not be printed (transferred). In other words, when the screen plating plate 52 is removed from the printed board 56 after the printing, the solder paste provided in the openings 52 may be removed together with the remaining solder paste.

In order to prevent this problem, the printing pressure is decreased so that the curvature of the board may be reduced. However, in the case where the printing pressure is decreased, due to the reaction force of the solder paste when the squeegee is advanced, it is not possible to remove the solder paste sufficiently so that the solder paste may remain on the screen printing plate 52.

In the method shown in FIG. 2, two squeegees are used differently, namely for printing operations in a right direction and a left direction. By a printing operation in a single direction, a single electronic circuit board can be printed. Accordingly, the method shown in FIG. 2 does not work as means for deformation of the printed board.

As shown in FIG. 3, in the case where the components are mounted on one surface of the two-surface mounting printing board with high density and then the printing paste is printed on the other surface of the board so that the printed board cannot be sufficiently supported (backup) from a lower side, removal of the solder paste remaining due to the curvature of the printed board and the curvature of the board have a trade-off relationship. This relationship is related to viscosity of the solder paste, an angle of the squeegee, hardness, advancing velocity of the squeegee or the like and therefore it is difficult to control. The same problem may occur in a case where not only the solder paste is printed on the printed board but also a printing paste (printing member of the wiring pattern) is printed on the printed board.

SUMMARY OF THE INVENTION

Accordingly, embodiments of the present invention may provide a novel and useful screen printing device and screen printing method solving one or more of the problems discussed above.

More specifically, the embodiments of the present invention may provide

One aspect of the present invention may be to provide a screen printing device configured to print a printing paste on a printed board, the printing paste being applied on a screen printing plate where openings corresponding to a pattern to be printed are formed, the screen printing device including a first squeegee advanced and pressed downward so that the printing paste is pushed on the printed board corresponding to the openings of the screen printing plate; and a second squeegee situated in the vicinity of the rear of the first squeegee, the second squeegee being configured to provide pressure forward and downward, the pressure having properties different from properties of a pressure provided by the first squeegee, wherein a printing operation by the second squeegee is performed right after a printing operation by the first squeegee.

Another aspect of the present invention may be to provide a screen printing method whereby a printing paste is printed on a printed board, the printing paste being applied on a screen printing plate where openings corresponding to a pattern to be printed are formed, the screen printing method including the steps of advancing and pressing downward a first squeegee so that the printing paste is pushed into the openings of the screen printing plate; and advancing a second squeegee situated in the vicinity of the rear of the first squeegee and being more flexible that the first squeegee, in parallel with the first squeegee, wherein a printing paste remaining on the screen printing plate due to printing with the first squeeze is removed by the second squeegee.

Other objects, features, and advantages of the present invention will become more apparent from the following detailed description when read in conjunction with the accompanying drawings.

DETAILED DESCRIPTION OF THE PREFERRED EMBODIMENTS

Figure 1:
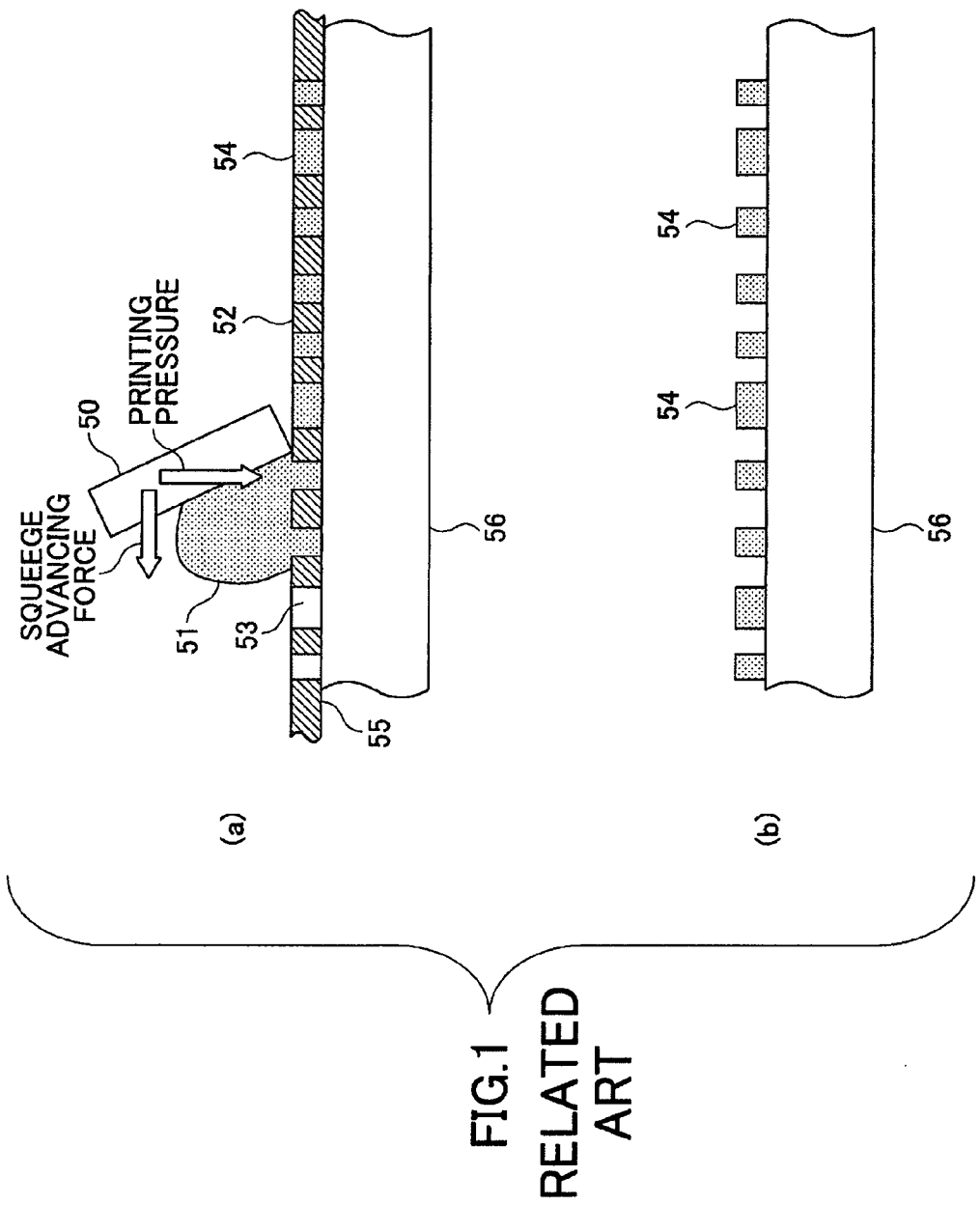
FIG. 1 is a schematic view for explaining related art screen printing using a solder paste.
Figure 2:
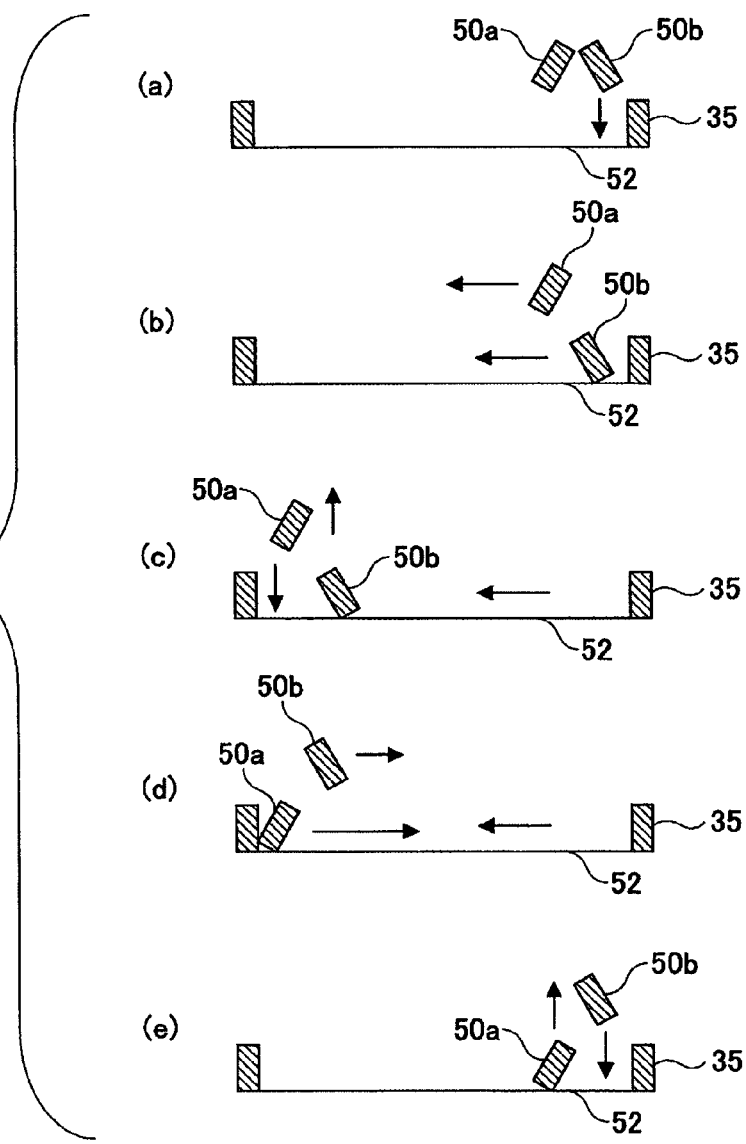
FIG. 2 is a view for explaining a case where two squeegees are used.
Figure 3:
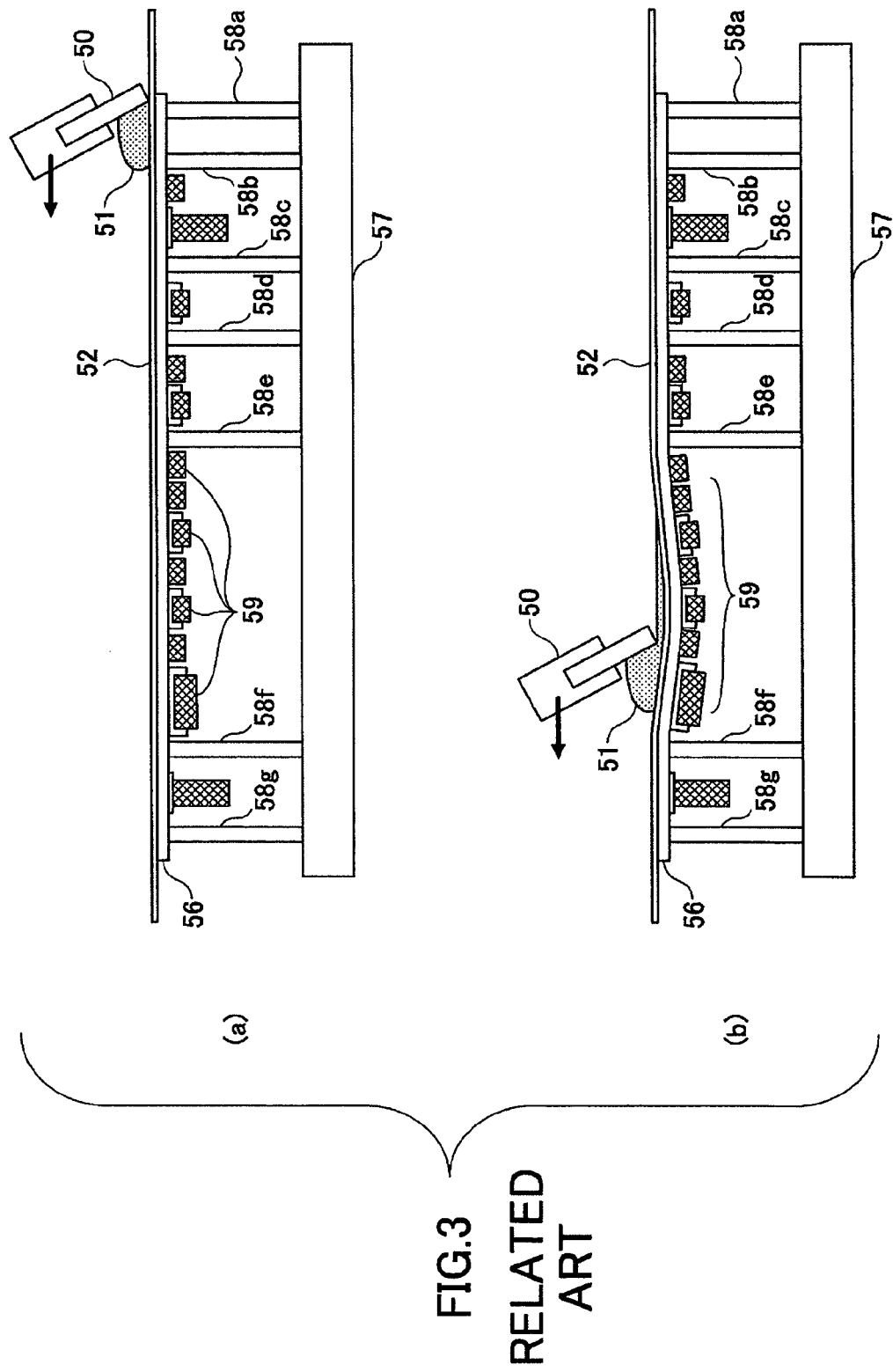
FIG. 3 is a view for explaining screen printing applied to a surface of a board having a rear surface where components are mounted.

A description is given below, with reference to FIG. 4 through FIG. 7 of embodiments of the present invention.

The following embodiments provide a screen printing device and a screen providing method whereby in a case where a printing paste is printed on a surface of a two surface mounted printed board after components are mounted on another surface of the board with high density or on a printed board which is curved downward, it is possible to prevent the printing paste from remaining on a metal mask.

In a case where two squeegees are provided with a certain gap, since one squeegee can have only a single property, it is difficult to satisfy the conflicting two properties (strength against the reaction force of the solder paste and flexibility corresponding to the curvature of the board). In the embodiments of the present invention, a first squeegee has strength which can prevail against the reaction force of the printing paste so that the printing paste is expanded on the metal mask and a printing paste situated at opening parts is pushed. Even if a certain amount of the printing paste remains at a curved portion of the board, a second squeegee which has sufficient flexibility and correspondence to the curvature of the board can be pushed onto the screen printing plate (metal mask) with a slight printing pressure so that only the remaining printing paste is removed. Hence, it is possible to realize good printing of the printing paste.

Furthermore, the first squeegee and the second squeegee may be provided attached to a single supporting part. The supporting part may be driven so that a downward printing pressure is applied by the squeegee printing pressure driving mechanism. A squeegee printing pressure mechanism may be fixed to a squeegee driving block. A squeegee driving block may be driven by a squeegee advancing and retracting driving part so as to advance and retract and thereby the first squeegee and the second squeegee can be operated in a body.

A supporting part configured to support the first squeegee can be attached to or detached from a supporting part configured to support the second squeegee. In this structure, it is possible to attached the second squeegee only when the printing paste remains on the screen printing plate provided on the printed board after the printing of the printing paste by the first squeegee.

In addition, the supporting part configured to support the first squeegee may be provided to a first squeegee printing pressure driving mechanism and the supporting part configured to support the second squeegee may be provided to a second squeegee printing pressure driving mechanism, and each of the mechanisms may individually apply the printing pressure. In this case, the first squeegee printing pressure driving mechanism and the second squeegee printing pressure driving mechanism may be provided attached to a single squeegee driving block so as to be advanced and retracted. With this structure, based on the degree of the curvature of the printed board or the like, it is possible to control so that proper pressures can be applied to the first squeegee and the second squeegee.

Furthermore, two pairs of supporting parts having the first squeegee and the second squeegee are provided. One pair may be used for printing the printing paste in one direction. Another pair may be used for printing the printing paste in an opposite direction. In this case, the second squeegee may be provided behind the first squeegee in an advancing direction of each pair.

In each of the above-mentioned structures, a downward printing pressure of the second squeegee may be, for example, one fifth through one tenth of that of the first squeegee and may not generate curvature of the printed board at a portion where the backup pins are not provided. The second squeegee may have sufficient flexibility.

Figure 4:
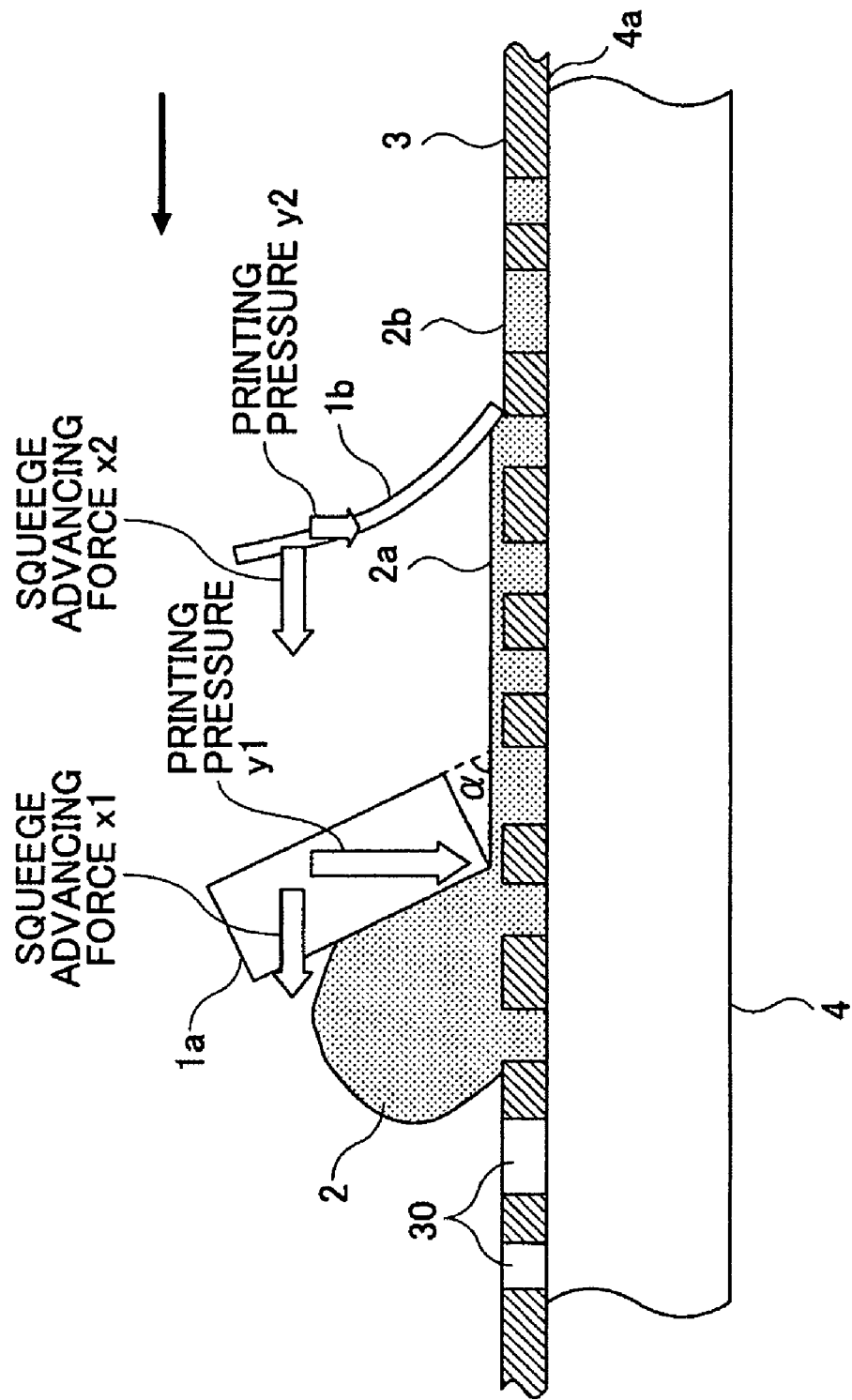
FIG. 4 is a schematic view showing a primitive structure of embodiments.

FIG. 4 is a schematic view showing a primitive structure of embodiments. In FIG. 4, a printing paste 2 is, for example, solder or wiring printed on a printed board 4. A printing paste 2a remains on a screen printing plate 3 after the printing by a first squeegee 1a. A printing paste 2b is provided in openings 30 formed in the screen printing plate 3 after the printing paste 2 is removed by a second squeegee 1b. The openings 30 are formed in the screen printing plate 3 according to a pattern to be printed. A numerical reference 4a represents an upper surface of the printed board.

The screen printing plate 3 is adhered on an upper surface of the printed board 4 (and a lower surface of the printed board 4 in a case where the printed board 4 is a two-surfaces mounting board) and the printing paste 2 is applied on a front side in a driving direction of the first squeegee 1a of the screen printing plate 3. The first squeegee 1a is made of a material having hardness and elasticity greater than a certain degree. For example, the first squeegee 1a may be made of urethane rubber having 90 degrees hardness. The flexible second squeegee 1b is provided right behind (for example, approximately 50 mm behind) the first squeeze 1a. The first squeegee 1a is inclined at a certain angle with a driving direction. The first squeegee 1a is driven forward by a driving part (not shown) and a printing pressure is applied to the first squeegee 1a downward so that the printing paste 2 is pushed forward by the squeegee advancing force x1. In addition, the printing paste 2 is pushed downward by the downward printing pressure y1 so that the printing paste 2 fills each opening part 30 of the screen printing plate 3, and thereby printing is performed. An inclination angle a formed by a front surface of the first squeegee 1a and the screen printing plate 3 is approximately 60 degrees.

After the printing operations of the printing paste 2 by the first squeegee 1a, due to downward curvature of a part of the printed board 4, the printing paste 2a may not be removed at an upper edge of the opening 30 by the first squeegee 1a so as to remain on the screen printing plate 3. In this case, by an advancing force x2 and a downward printing pressure y2 of the second squeegee 1b, the printing paste 2a remaining on an upper side of the opening can be surely removed. Here, the second squeegee 1b is provided behind the first squeegee 1a and driven simultaneously with the first squeegee 1a in the same direction as the first squeegee 1a. The second squeegee 1b has flexibility greater than that of the first squeegee 1a. After the printing operations by the first squeegee 1a and the second squeegee 1b are performed, by raising the screen printing plate 3 upward or moving the printed wiring board 4 downward, the printing paste 2b is printed in a position corresponding to the opening part of the printed board 4.

Figure 5:
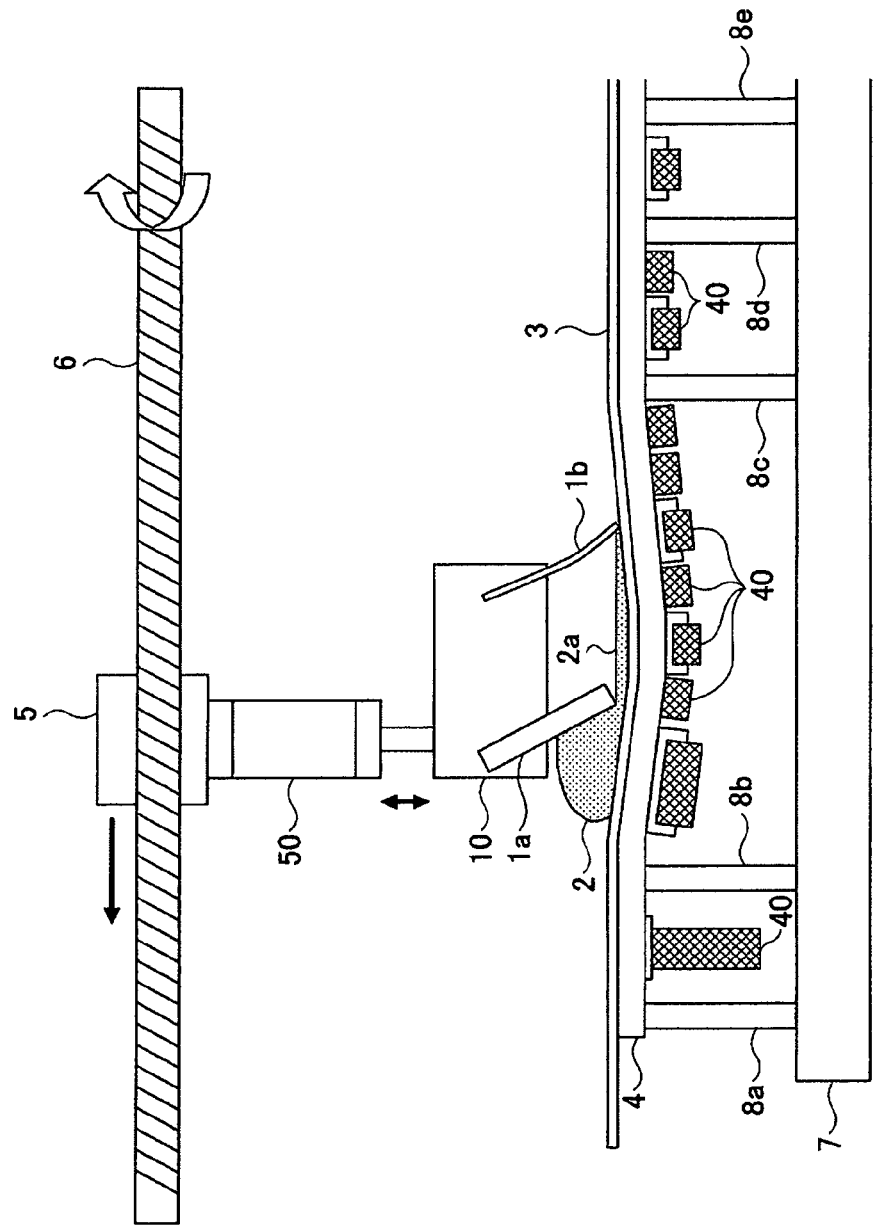
FIG. 5 is a schematic view showing a structure of a first embodiment.

FIG. 5 is a schematic view showing a structure of a first embodiment.

In FIG. 5, a numerical reference 1a represents a first squeegee and a numerical reference 1b represents a second squeegee. A numerical reference 2 is a solder paste which is one of the printing pastes. A numerical reference 2a represents a solder paste remaining on an upper side of the opening after the printing by the first squeegee 1a. A numerical reference 3 represents a metal mask which is the same as the screen printing plate shown in FIG. 4. A numerical reference 4 is a two surface mounting printed board. The first squeegee 1a and the second squeegee 1b are provided attached to a squeegee supporting part 10. A squeegee driving block 5 is provided in a body with a squeegee printing pressure driving mechanism 50. The squeegee driving block 5 is engaged with a screw of a squeegee advancing and retracting driving shaft 6. The squeegee driving block 5 is driven forward and backward by rotating the squeegee advancing and retracting driving shaft 6. The squeegee printing pressure driving mechanism 50 is configured to apply a downward printing pressure to the squeegee supporting part 10.

By rotating the squeegee advancing and retracting driving shaft 6, the squeegee printing pressure driving mechanism 50 makes the squeegee driving block 5 advance and retract, so that the squeegee printing pressure driving mechanism 50 and the squeegee supporting part 10 are driven together.

In the first embodiment, urethane rubber having 90 degrees of a rubber hardness and 6 mm of thickness is used as the first squeegee 1a. Urethane rubber having 90 degrees of a rubber hardness and 2 mm of thickness is used as the second squeegee 1b. The length of the second squeegee 1b is, (for example, approximately 2 mm) greater than the length of the first squeegee 1a and therefore the function for removing the solder paste 2a remaining after the printing by the first squeegee 1a is improved. In addition, the second squeegee 1b is provided behind the first squeegee 1a and, for example, approximately 50 mm separated from the first squeegee 1a. Most of a pressure of 1.5 N/cm are applied the squeegee supporting part 10 from the first squeegee 1a as a printing pressure being set by driving the squeegee printing pressure driving mechanism 50. Here, the pressure of 1.5 N/cm means 1.5 N of a downward driving force per 1 cm of the squeegee length.

In addition, the second squeegee 1b is more flexible than the first squeegee 1a, and the length of the second squeegee 1b is, (for example, approximately 2 mm) is greater than the length of the first squeegee 1a. Accordingly, when the squeegee comes in contact with the metal mask, it is possible to correspond to the curvature of the board by using approximately 2 mm as a deformation margin.

In the structure shown in FIG. 5, a two surface mounting board is used as the printed board 4. After components 40 are mounted on one surface of the board 40, the solder paste (printing paste) can be properly printed on another surface. In FIG. 5, plural components 40 are mounted on a lower side surface of the board 4. A base 7 is provided in a fixed position and made of unchangeable solids. Numerical references 8a through 8e represent backup pins. Upper end parts of the backup pins 8a through 8e are provided in portions of the lower side surface of the printed board 40 where the components 40 are not provided. Lower end parts of the backup pins 8a through 8e are vertically fixed on the base 7.

In the example shown in FIG. 5, a portion of the metal mask 3 and the printed board 4 of a section between the backup pins 8b and 8c where the components 40 are provided at high density is curved downward by the downward printing pressure by the first squeegee 1a. Accordingly, when the squeegee supporting part 10 moves forward with the squeegee printing pressure driving mechanism 50, the remaining amount 2a of the solder paste may be formed on the above-mentioned portion after the printing by the first squeegee 1a. However, by a squeegee advancing force and the printing pressure of the second squeegee 1b, it is possible to remove the remaining amount 2a of the solder paste. In a case of not only the printed board 4 having a portion where a small number of the backup pins are provided but also the printed board being curved regardless of the backup pins, the remaining solder paste can be removed by the second squeegee 1b.

Figure 6:
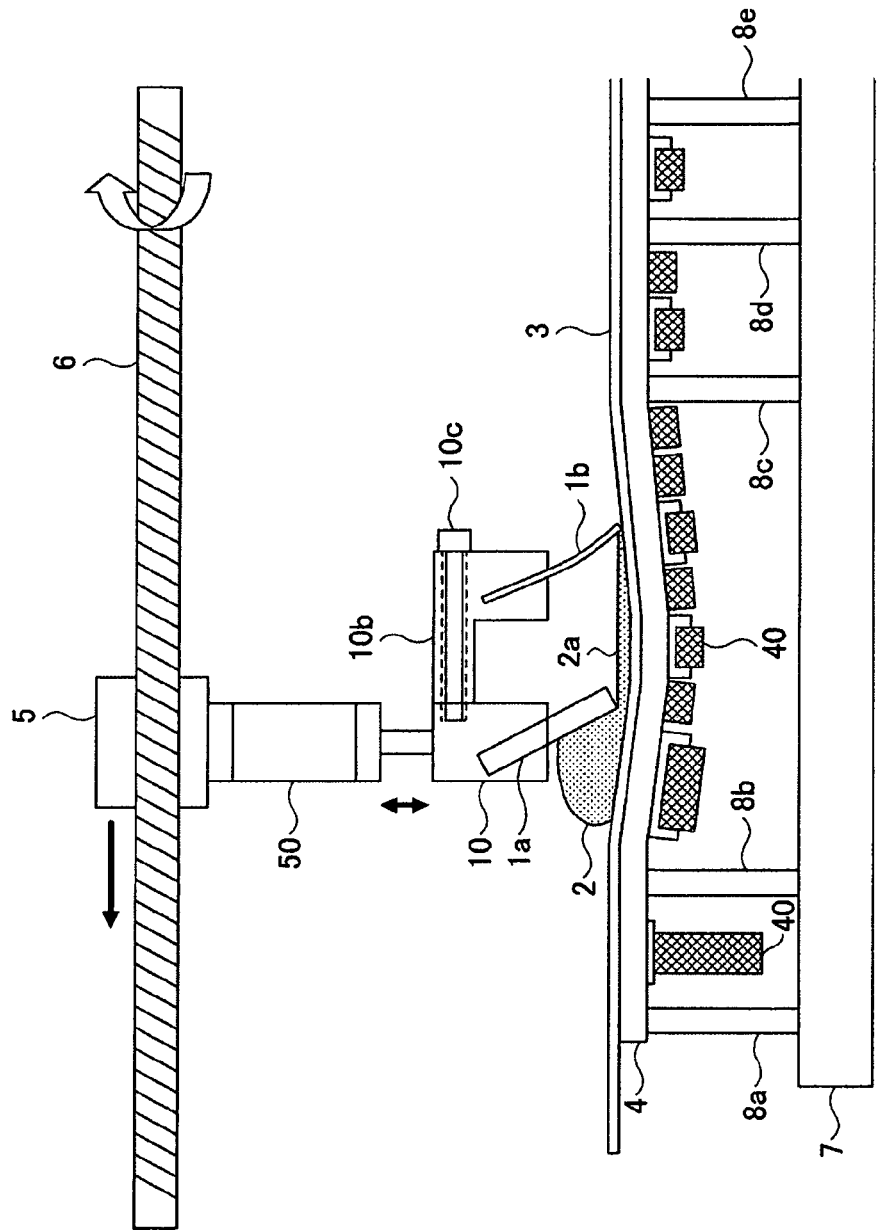
FIG. 6 is a schematic view showing a structure of a second embodiment.

FIG. 6 is a schematic view showing a structure of a second embodiment. In the above-discussed first embodiment, the first squeegee 1a and the second squeegee 1b are provided attached to the squeegee supporting part 10 in a body. In the second embodiment, the second squeegee 1b is provided detachably. In FIG. 6, parts that are given the numerical references 1a, 1b, 2 through 7, and 8a through 8e correspond to the parts having the same numerical references of FIG. 5. Only the first squeegee 1a is provided attached to a first squeegee supporting part 10a. The second squeegee 11 is provided attached to a second squeegee supporting part 10b. A second squeegee detaching screw 10c is configured to attach or detach the second squeegee supporting part 10b to or from the first squeegee supporting part 10a.

Thus, in this example, the second squeegee supporting part where the second squeegee 1b is provided is detachably provided to the first squeegee supporting part 10a. Hence, only in a case where printing is performed on one surface of the two surface mounting printed board after components are mounted on another surface of the board or in a case where, for example, the printed board is curved downward so that the printing paste remains on the surface after the printing by the first squeegee 1a, the second squeegee 1b may be provided so as to remove the remaining printing paste. There is no need to use the second squeegee 1b for printing on the printed board which is not curved at a normal printing. In this case, the second squeegee supporting part 10b is detached from the first squeegee supporting part 10a for printing.

Figure 7:
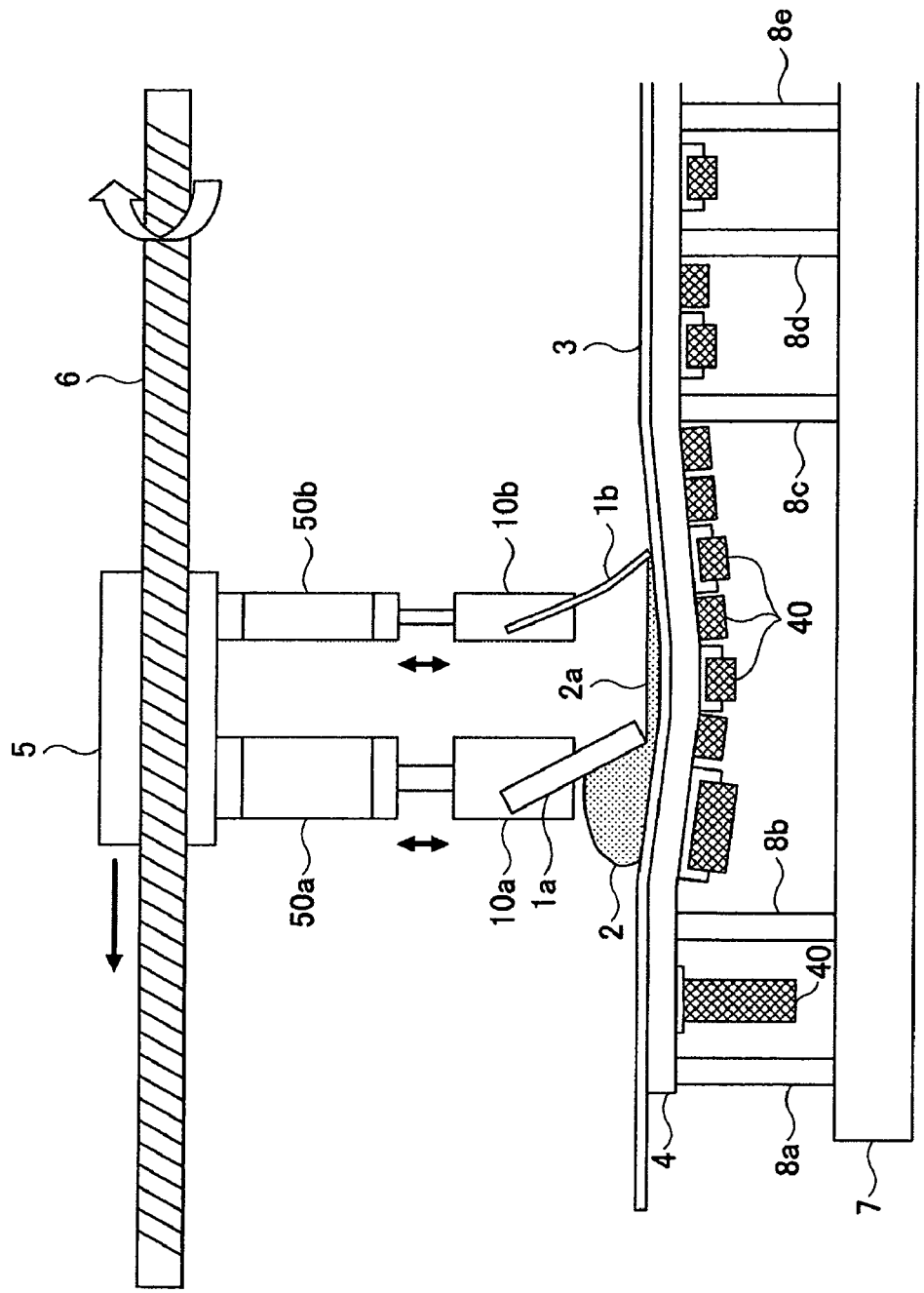
FIG. 7 is a schematic view showing a structure of a third embodiment.

FIG. 7 is a schematic view showing a structure of a third embodiment. In the first and second embodiments shown in FIG. 5 and FIG. 6, the printing pressures are applied to both the first squeegee 1a and the second squeegee 1b by a single squeegee printing pressure driving mechanism 50. In the third embodiment, the squeegee printing pressures to the first squeegee 1a and the second squeegee 1b are separately applied by a printing pressure driving mechanism.

In FIG. 7, parts that are given the numerical references 1a, 1b, 2 through 7, and 8a through 8e correspond to the parts having the same numerical references of FIG. 5 and FIG. 6 and explanation thereof is omitted. In FIG. 7, a first squeegee printing pressure driving mechanism 50a and a second squeegee printing pressure driving mechanism 50b are fixed to the squeegee driving block 5. The first squeegee supporting part 10a is driven by the first squeegee printing pressure driving mechanism 50a. The second squeegee supporting part 10b is driven by the second squeegee printing pressure driving mechanism 50b.

In the third embodiment, the first squeegee printing pressure driving mechanism 50a and the second squeegee printing pressure driving mechanism sob fixed to the squeegee driving block 5 are advanced based on the rotation of the squeegee advancing and retracting driving shaft 6. The printing pressure of the first squeegee 1a is controlled by controlling the driving force of the first squeegee printing pressure driving mechanism 50a. The printing pressure of the second squeegee 1b is controlled by controlling the driving force of the second squeegee printing pressure driving mechanism 50b. More specifically, for example, the printing pressure of the first squeegee is set as 1.5 N/cm and the printing pressure of the second squeegee is set as 0.2 N/cm.

Thus, according to the screen printing device and the screen printing method of the embodiments, in a case where the printing paste such as the solder paste is screen printed on the printed board which is the printing subject and a mechanism for supporting the printed board from a lower side is not sufficiently provided so that the printed board is partially deformed, it is possible to prevent the printing paste from remaining on the screen printing plate.

Because of this, in a case where the two surface mounting printed board having a high mounting density cannot be sufficiently back up or in a case where the printed board is curved, it is possible to perform good printing without the printing paste or the solder paste remaining so that components provided on the rear surface of the two surface mounting printed board are not damaged.

Although the invention has been described with respect to specific embodiments for a complete and clear disclosure, the appended claims are not to be thus limited but are to be construed as embodying all modifications and alternative constructions that may occur to one skilled in the art that fairly fall within the basic teachings herein set forth.

This patent application is based on Japanese Priority Patent Application No. 2007-331649 filed on Dec. 25, 2007, the entire contents of which are hereby incorporated herein by reference.

What is claimed is:

1. A screen printing device configured to print a printing paste on a printed board, the printing paste being applied on a screen printing plate where openings corresponding to a pattern to be printed are formed, the screen printing device comprising:

a first squeegee advanced and pressed downward so that the printing paste is pushed on the printed board corresponding to the openings of the screen printing plate; and a second squeegee situated in the vicinity of the rear of the first squeegee, the second squeegee having a length greater than a length of the first squeegee, the second squeegee being more flexible than the first squeegee, the second squeegee being configured to provide pressure forward and downward, the pressure having properties different from properties of a pressure provided by the first squeegee, wherein a printing operation by the second squeegee is performed right after a printing operation by the first squeegee; and a downward printing pressure of the second squeegee is a value in the range of one fifth through one tenth of a downward printing pressure of the first squeegee.

2. The screen printing device as claimed in claim 1, wherein the first squeegee has a rigid structure having a thickness;

the second squeegee has a flexible structure having a thickness less than the thickness of the first squeegee; and printing paste remaining on the screen printing plate after the printing paste is printed by the first squeegee is removed by the second squeegee.

3. The screen printing device as claimed in claim 2, wherein the second squeegee is provided at a single squeegee supporting part with a minute gap with the first squeegee;

the squeegee supporting part is provided at a squeegee printing pressure driving mechanism, the squeegee printing pressure driving mechanism being configured to apply a downward pressure to the first squeegee and the second squeegee; and the squeegee printing pressure driving mechanism is provided at a squeegee driving block configured to advance or retract each squeegee.

4. The screen printing device as claimed in claim 2, wherein the first squeegee is provided attached to a first squeegee supporting part and the second squeegee is provided attached to a second squeegee supporting part;

the first squeegee supporting part is connected to a first squeegee printing pressure driving mechanism and the second squeegee supporting part is connected to a second squeegee printing pressure driving mechanism;

the first squeegee printing pressure driving mechanism and the second squeegee printing pressure driving mechanism are provided attached to a common squeegee driving block so that the second squeegee is positioned right behind the first squeegee; and a pressure by the first squeegee printing pressure driving mechanism and a pressure by the second squeegee printing pressure driving mechanism are individually controlled.

5. The screen printing device as claimed in claim 1, wherein the first squeegee is provided on a first squeegee supporting part and the second squeegee is provided on a second squeegee supporting part; and the second squeegee supporting part is detachably provided on the first squeegee supporting part.

6. A screen printing method whereby a printing paste is printed on a printed board, the printing paste being applied on a screen printing plate where openings corresponding to a pattern to be printed are formed, the screen printing method comprising the steps of:

advancing and pressing downward a first squeegee so that the printing paste is pushed into the openings of the screen printing plate; and advancing a second squeegee situated in the vicinity of the rear of the first squeegee and being more flexible than the first squeegee, in parallel with the first squeegee, the second squeegee having a length greater than a length of the first squeegee, wherein a printing paste remaining on the screen printing plate due to printing with the first squeegee is removed by the second squeegee; and a downward printing pressure of the second squeegee is a value in the range of one fifth through one tenth of a downward printing pressure of the first squeegee.

7. The screen printing method as claimed in claim 6, wherein the first squeegee is provided attached to a first squeegee supporting part and the second squeegee is provided attached to a second squeegee supporting part;

the first squeegee supporting part is provided attached to a first squeegee printing pressure driving mechanism; and printing is performed by causing the printing pressure applied by the first squeegee printing pressure mechanism to be greater than a printing pressure applied by a second squeegee printing pressure mechanism.

8. A screen printing device configured to print a printing paste on a printed board, the printing paste being applied on a screen printing plate where openings corresponding to a pattern to be printed are formed, the screen printing device comprising:

a first squeegee advanced and pressed downward so that the printing paste is pushed on the printed board corresponding to the openings of the screen printing plate; and a second squeegee situated in the vicinity of the rear of the first squeegee, the second squeegee having a length greater than a length of the first squeegee, the second squeegee being more flexible than the first squeegee, the second squeegee being configured to provide pressure forward and downward, the pressure having properties different from properties of a pressure provided by the first squeegee, wherein a printing operation by the second squeegee is performed right after a printing operation by the first squeegee;

the first squeegee has a rigid structure having a thickness;

the second squeegee has a flexible structure having a thickness less than the thickness of the first squeegee;

printing paste remaining on the screen printing plate after the printing paste is printed by the first squeegee is removed by the second squeegee;

the first squeegee is provided attached to a first squeegee supporting part and the second squeegee is provided attached to a second squeegee supporting part;

the first squeegee supporting part is connected to a first squeegee printing pressure driving mechanism and the second squeegee supporting part is connected to a second squeegee printing pressure driving mechanism;

the first squeegee printing pressure driving mechanism and the second squeegee printing pressure driving mechanism are provided attached to a common squeegee driving block so that the second squeegee is positioned right behind the first squeegee; and a pressure by the first squeegee printing pressure driving mechanism and a pressure by the second squeegee printing pressure driving mechanism are individually controlled.

* * * * *